United States Patent
Sugai

(10) Patent No.: US 7,683,813 B2
(45) Date of Patent: Mar. 23, 2010

(54) DIGITAL-TO-ANALOG CONVERTER CARRYING OUT CALIBRATION OPERATION FOR CURRENT SOURCE CELLS

(75) Inventor: Danya Sugai, Tokyo (JP)

(73) Assignee: Oki Semiconductor Co., Ltd. (JP)

(*) Notice: Subject to any disclaimer, the term of this patent is extended or adjusted under 35 U.S.C. 154(b) by 0 days.

(21) Appl. No.: 12/142,150

(22) Filed: Jun. 19, 2008

(65) Prior Publication Data
US 2009/0015454 A1    Jan. 15, 2009

(30) Foreign Application Priority Data
Jul. 11, 2007   (JP) ............... 2007-181972

(51) Int. Cl.
*H03M 1/10* (2006.01)
(52) U.S. Cl. .............. 341/120; 341/144; 341/145; 341/133; 341/136
(58) Field of Classification Search ............. 341/144, 341/120, 136, 117, 118, 119, 145, 133
See application file for complete search history.

(56) References Cited

U.S. PATENT DOCUMENTS 5,646,619 A * 7/1997 Daubert et al. ............ 341/118
7,042,374 B1 * 5/2006 Manganaro .............. 341/120

FOREIGN PATENT DOCUMENTS

JP   9289450   11/1997

OTHER PUBLICATIONS

Hsin-Hung, Chen et al. "A 14-b MS/s CMOS DAC with Digital Background Calibration", 2006 Symposium on VLSI Circuits Digest of Technical Papers, 2006 IEEE.

* cited by examiner

*Primary Examiner*—Jean B Jeanglaude
(74) *Attorney, Agent, or Firm*—Studebaker & Brackett PC; Donald R. Studebaker

(57) ABSTRACT

A current cell matrix type of digital-to-analog (D/A) converter to prevent deterioration of a.c. characteristics on a current path for digital-to-analog conversion includes a array of current source cells arranged in a matrix configuration. Each current source cell includes a current source transistor to generate the cell current. During the regular operation, the cell current is flowed on output lines via a first transistor connected in cascode to the current source transistor. During the calibration operation, the cell current is flowed into a current comparator via a second transistor connected in cascode to the current source transistor. This prevents parasitic capacitance from being additively caused in switches for the first transistor and in another switch for the second transistor to prevent deterioration of a.c. characteristics on the current path.

6 Claims, 2 Drawing Sheets

DIGITAL-TO-ANALOG CONVERTER CARRYING OUT CALIBRATION OPERATION FOR CURRENT SOURCE CELLS

BACKGROUND OF THE INVENTION

1. Field of the Invention

The present invention relates to a digital-to-analog (D/A) converter, and more particularly to a current cell matrix type of D/A converter for calibrating the current value of a current source cell.

2. Description of the Background Art

Conventionally, there is a type of digital-to-analog (D/A) converter having a plurality of current source cells arranged in a matrix to receive digital data to be converted to analog data through a row decoder and a column decoder. This type of D/A converter is able to convert the current value, differential-outputted from each current source cell, to an output voltage by output end resistors to deliver the resultant output voltage as an analog output.

The current source cells operate as current sources to generate cell currents in proportion to a preset bias voltage and to differential-output the resultant cell currents in response to the input codes derived from digital data. Each current source cell includes a transistor, operating as a current source, and two current source switches, respectively controlling the positive and negative outputs of the cell current. These switches are actuated in accordance with the input codes.

Thus, the amount of current flowing through the output end resistors of the D/A converter is varied by the current source switch of each current source cell.

The transistors for each current source cell may involve unevenness caused by variation in manufacturing process to generate the current value involving an error. Such an error of the current should be corrected. For example, Hsin-Hung Chen, et al., "A 14-b 150MS/s CMOS DAC with Digital Background Calibration" 2006 Symposium on VLSI Circuits Digest of Technical Papers, proposes a digital background self-calibration scheme of the CMOS DAC (Complementary Metal-Oxide Semiconductor Digital-to-Analog Converter). In this scheme, a current source for correction, such as a dummy current source cell (CAL_DAC), is provided in a current source cell, such as a digital background calibrating current source cell, to adjust the cell current.

In this scheme, the D/A converter carries out calibration for determining the correction value of the current source for correction. During the process of the calibration, each current source cell generates current to output the resultant current via a calibration switch provided on the correction path. In the D/A converter, the current value in each current source cell is converted to a corresponding analog voltage value by a resistive current-to-voltage converter. The analog voltage value is converted to corresponding digital data by a $\Delta\Sigma$ modulator and a digital counter. On the basis of the result of the digital-conversion, a calibration decision circuit calculates a digital value to be delivered to the current source for correction, i.e. the correction value, and causes the calculated correction value to be stored in a memory.

A D/A converter disclosed by Japanese patent laid-open publication No. 289450/1997 operates in accordance with a segment system in which D/A converted outputs of upper bit segments equalized in current value are summed to D/A converted outputs of lower bit segments weighted in current to produce an resultant analog output. To the upper bit segments, a least one segment is added, the voltage value for switching which and the region for outputting the lower bits are controlled to correct an error in that segment.

Such conventional D/A converters use the calibration technique for ameliorating its accuracy to correct the current value of the current source cells. However, the effect brought by the connections for calibration, i.e. circuit paths for correction, is not taken into account.

For example, in the constitution for calibration as disclosed by the above Hsin-Hung Chen, et al., the CMOS DAC is provided with two switches for current source outputting and one switch for calibration for a transistor operating as a current source. However, the switches thus connected in the CMOS DAC cause the capacitance additive in a node of the switch for the current source to be increased. For example, when the switch for calibration is turned on in operation for calibration and off in regular operation, the parasitic capacitance by the switch for calibration is additively caused in the course of regular operation.

Thus, in a current source cell, when large parasitic capacitance is caused additively on the node of the switch for the current source, the effect of capacitance mismatch between the cells increases to deteriorate alternating current characteristics of the D/A converter.

If the number of switches in the current source cell is increased in order to prevent deterioration of the alternating current characteristics of the D/A converter, then the circuit is increased in size.

SUMMARY OF THE INVENTION

It is an object of the present invention to provide a digital-to-analog converter which Is capable of correcting the current generated in current source cells arrayed in matrix configuration without deteriorating its alternating current characteristics.

In accordance with the present invention, there is provided a digital-to-analog (D/A) converter including a plurality of current source cells, arranged in a matrix configuration. The D/A converter of the present invention comprises an output current oath section or digital-to-analog conversion in the regular operation and a correcting current path section for the calibration operation, as a current path for conducting a cell current generated in the current source cells. Each current source cell includes a first transistor serving as a current source that generates the cell current for a predetermined bias voltage applied thereto. In the current source cell, the first transistor is connected during the regular operation to the output current path section in cascade to flow the cell current through the output current path section and during the calibration operation to the correcting current path section in cascade to flow the cell current through the correcting current path section. The D/A converter also comprises a current corrector operative in response to a correction value obtained on the correcting current path section for generating the correction current that is used for correcting the cell current.

According to the digital-to-analog (D/A) converter of the present invention, each current source cell comprises two current source transistors functioning as current sources so that, during the regular operation, the two transistors are connected in cascode to provide an output current path section. The transistors then conduct the cell current to flow on the output current path section. When the current source cell operates for calibration, one of the current source transistors and a transistor for calibration are connected in cascade, that is, the transistor for calibration is used in place of the other current source transistor, to provide a correcting current path section. Then, the current source transistor and the calibration transistor conduct the cell current to flow on the correcting current path section.

Thus, each current source cell in the D/A converter carries out the operation for calibration to determine a correction value. The correction value is used to correct current value of each current source cell. It is therefore possible to correct differences in the current values ascribable to process variations.

Moreover, with the D/A converter, the current path for calibration is not connected to a node connected to a switch for the current source, but is connected to a junction point between the current source transistors connected in cascode to each other. It is therefore possible to prevent the parasitic capacitance from being additively caused on the node of the switch for the current source.

Additionally, with the D/A converter, if there is an error caused by the process variations between the current source transistors used for the regular operation and the calibration transistors used for the operation for calibration, these transistors are arranged in proximity from each other so that the adverse effect caused by the process variations can be reduced extensively.

Furthermore, the D/A converter may comprise a single current corrector for correcting the cell current generated in the plurality of current source cells, the single current corrector being shared with those current source cells, thereby reducing the circuit size.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
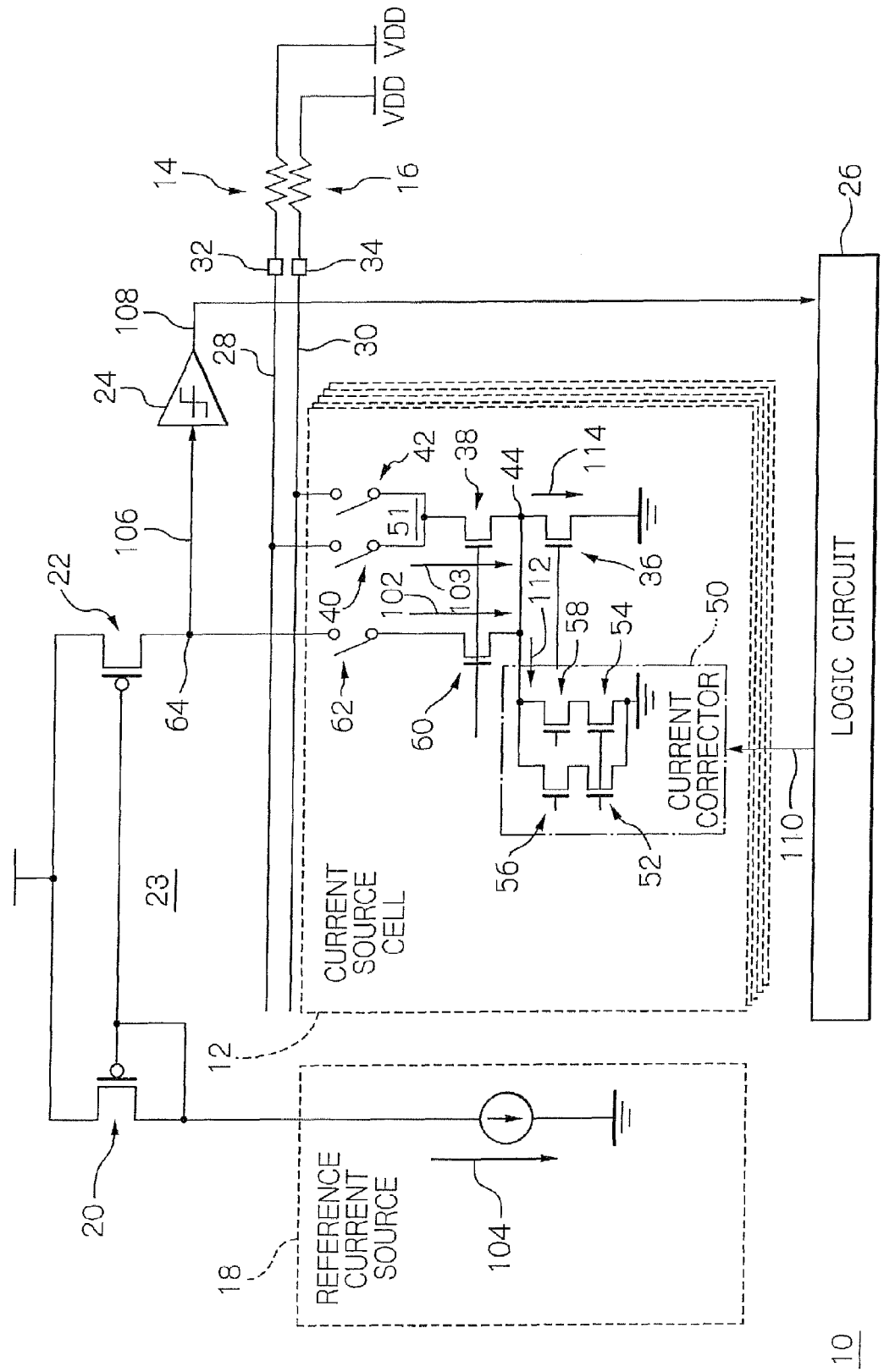
FIG. 1 is a schematic block diagram showing a preferred embodiment of a digital-to-analog (D/A) converter according to the present invention.

With reference to the accompanying drawings, a preferred embodiment of a digital-to-analog (D/A) converter according to the present invention will be described in detail. As shown in FIG. 1, a D/A converter 10 converts digital data to analog data by a plurality of current source cells 12 arranged in a matrix configuration to output the resultant current values to output end resistors 14 and 16, thereby obtaining the analog data. For that aim, the D/A converter 10 includes a reference current source 18, transistors 20 and 22, a current comparator 24 and a logic circuit 26, which are interconnected as illustrated to calibrate the current values obtained by each current source cell 12. It is noted that parts or elements not directly relevant to understanding the present invention will neither be described nor shown for avoiding redundancy.

Figure 2:
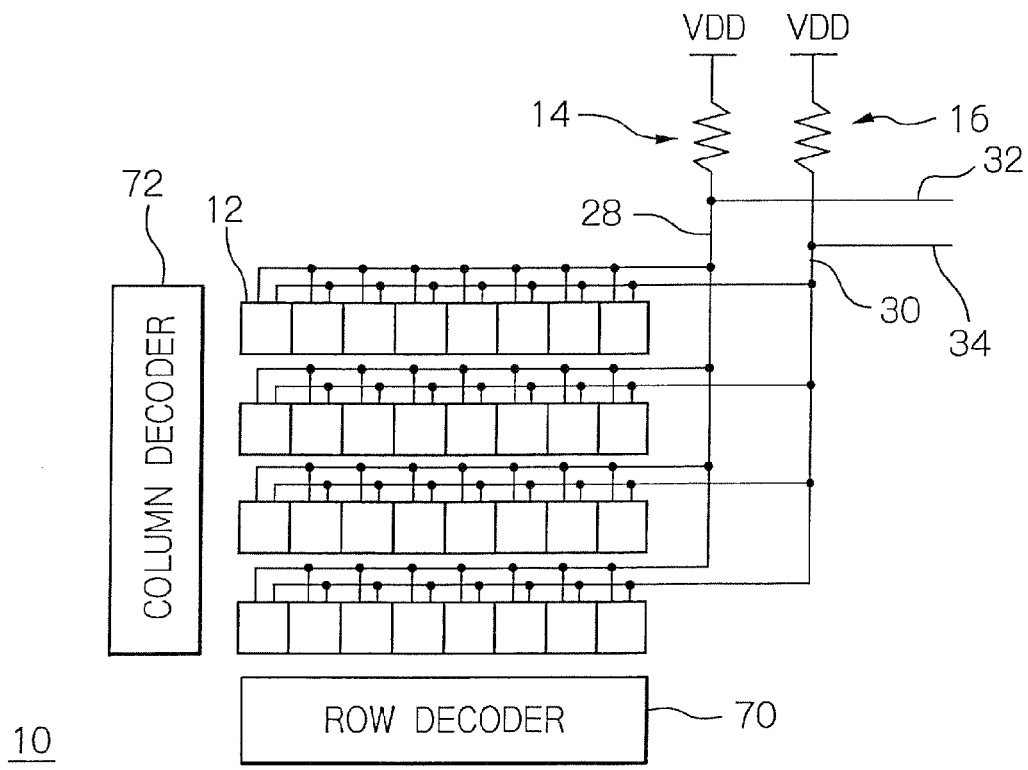
FIG. 2 is a schematic block diagram showing an array of current source cells in the D/A converter of the embodiment shown in FIG. 1.

Referring to FIG. 2, the D/A converter 10 may be formed by a matrix array of current source cells 12, to which digital data for D/A conversion are fed as input by a row decoder 70 and a column decoder 72. Although a multiplicity of current source cells may actually be arranged in the D/A converter 10, only a smaller number of current source cells 12 are shown in FIGS. 1 and 2 for simplicity.

The D/A converter 10 is adapted to receive the currents differentially outputted from the current source cells 12 on output lines 28 and 30, which are in turn connected to output end resistors 14 and 16, respectively, and thence to a reference voltage, e.g. power supply voltage VDD. On these output lines 28 and 30, output terminals 32 and 34 are provided between the current source cells 12 and the output end resistors 14 and 16, respectively.

In accordance with the currents flowing from the current source cells 12, the voltages applied to the output end resistors 14 and 16 are varied, that is, the voltages outputted from the output terminals or contact pads 32 and 34 are varied. The digital input is converted in this manner to a corresponding analog output.

The current source cell 12 includes current source transistors 36 and 38 functioning as current sources, one 36 of which is connected in cascode to the other 38. The one transistor 36 has its source electrode connected to another reference voltage, e.g. grounded, while the other transistor 38 has its drain electrode connected via switches 40 and 42 to the output lines 28 and 30, respectively. The circuitry consisted of the transistors 36 and 38 and the switches 40 and 42 is referred to hereinbelow as a current source block 51.

The current source block 51 runs, for instance, to supply the bias voltage to the current source transistors 36 and 38. The current source block 51 controls the switches 40 and 42 in accordance with the digital data for D/A conversion, i.e. input codes obtained from the row decoder 70 and the column decoder 72, so as to switch the ON and OFF conduction states between the drain electrode of the transistor 38 and the output lines 28 and 30, respectively.

The current source cell 12 also includes a current corrector 50 adapted to calibrate the differential current values delivered from the current source block 51, to which the current corrector 50 is electrically connected. The current corrector 50 includes a plurality of correction transistors 52 and 54 serving as current sources for calibration correction, and a plurality of switching transistors 56 and 58 serving as switches for switching the ON and OFF conduction states between the correction transistors 52 and 54, respectively, and the current source block 51.

In the current source cell 12 of the illustrative embodiment, particularly, a calibration transistor 60 is connected in cascode to the current source transistor 36, which is connected via the transistor 60 to the current comparator 24. The current source cell 12 also includes a switch 62 for switching its ON and OFF states of the connection to the current comparator 24, and the calibration transistor 60 connected to the current comparator 24 via the switch 62.

The current source cell 12 may preferably have a path for use in calibration operation of the calibration transistor 60 connected to a junction point between the current source transistors 36 and 38. That causes in calibration operation the current source transistor 36 and the calibration transistor 60 to function as a couple of transistors operating as a current source. That is, the transistor 60 is used in place of the current source transistor 38. In the illustrative embodiment, the same bias voltage is supplied to the transistors 38 and 60.

In the current source cell 12, if the switch 40 or 42 is in its ON state the transistor 38 allows a cell current 102 to flow therethrough, while if the switch 62 is in its ON state the transistor 60 allows the cell current to flow therethrough.

The reference current source 18 generates a reference current 104. With the illustrative embodiment, this current 104 is set beforehand.

The D/A converter 10 further includes transistors 20 and 22 respectively positioned on the side of the reference current source 18 and the side of the current source cell 12 to form a current mirror circuit 23 together. In the illustrative embodiment, the transistor 20 is connected simply to the reference current source 18, while the other transistor 22 is connected to, in particular, the calibration transistor 60 of the current source cell 12 and also to the current comparator 24.

The current mirror circuit 23 including the transistors 20 and 22 generates the current in proportion to the size ratio between the side of the reference current source 18 and the side of the current source cell 12. In the illustrative embodiment, the current substantially equal to the reference current 104 is generated on the side of the current source cell 12.

In the illustrative embodiment, the switch 62 on the side of the current source cell 12 is connected to the calibration transistor 60 and the current comparator 24. Thus, according to the current mirror circuit 23, if an error caused by the mirror circuit 23 is not taken into account, the sum of a cell current 102 flowing through the calibration transistor 60 and the current 106 supplied to the comparator 24 is substantially equalized to the reference current 104.

More specifically, by the current mirror circuit 23, the input current 106 substantially equal to the difference between the reference current 104 and the cell current 102 is supplied to the current comparator 24. When the reference current 104 is larger than the cell current 102, the current 106 becomes of a positive value to flow into the comparator 24. When the reference current 104 is smaller than the cell current 102, the current 106 becomes of a negative value to flow out from the comparator 24.

The current comparator 24 is adapted to compare the input current 106 to, for example, a predetermined threshold value. Specifically, the comparator 24 determines which is larger of the reference current 104 and the cell current 102 and outputs a decision result 108 to the logic circuit 26.

The logic circuit 26 is adapted for deciding a code directing the quantity of the current 112, i.e. a correction value 110, conducted through the current corrector 50. In the illustrative embodiment, the correction value 110 for the current quantity 112 to be used during the regular operation is determined in accordance with the decision result 108 by the current comparator 24 in the course of calibration operation. Preferably, the logic circuit 26 may have, e.g. a memory, not shown, adapted for storing the correction value 110.

The D/A converter 10 of the illustrative embodiment carries out the respective calibration operation on the plurality of current source cells 12. That is, the current comparator 24 finds a decision result 108 from each current source cell 12 and the logic circuit 26 determines the code 110 from that current source cell 12.

Preferably, when the D/A converter 10 carries out the calibration operation, the current corrector 50 of the current source cell 12 controls the correction current value 112 to be varied little by little. In addition, the current corrector 50 preferably causes the correction current value 112 at a transition point of the sign of the input current 106 of the current comparator 24 to be stored in, e.g. a memory.

Now, the operation of the D/A converter 10 of the illustrative embodiment will be described directed to an example of regular operation for D/A conversion.

In the D/A converter 10, the bias voltage and the input code corresponding to digital data for conversion are supplied to each current source cell 12. In the current source cell 12, a cell current 103 is generated between the node 44 of the current source block 51 and the predetermined reference voltage, i.e. ground (GND) in the embodiment.

During the regular operation, the switch 62 is in its OFF state initially. However, when the input codes corresponding to the digital data are supplied to the switches 40 and 42 of the current source cell 12, the switches 40 and 42 are changed over in response to the digital data.

If the switch 40 and/or the switch 42 are in the ON state thereof, then the cell current 103 flows through the current source transistor 38 in-to the output lines 28 and/or 30. On these output lines 28 and 30, the cell current 103 is converted by the output end resistors 14 and 16 to a corresponding output voltage, which is in turn delivered as an output via the output terminals 32 and 34.

In addition, if the switch 56 and/or the switch 58 of the current corrector 50 are in the ON state thereof during the regular operation, the cell current 103 may be expressed as the sum of a current 114 flowing through the current source transistor 36 and a current 112 flowing through the transistors 52 and/or 54 of the correction current source of the current corrector 50. The cell current 112 thus serves as a current source for correcting an error caused by current mismatch of the current 114 of the current source transistor 36. Although the illustrative embodiment configures the current corrector 50 by four transistors 52, 54, 56 and 58, the block 50 may consist of more transistors than this embodiment.

Next, the operation of the D/A converter 10 of the illustrative embodiment will be described in terms of an example of operation for calibration.

In the D/A converter 10, as with the regular operation, the bias voltage and the input codes corresponding to digital data for conversion are supplied to the respective current source cells 12.

During the operation for calibration, the switch 62 is in its ON state, while the switches 40 and 42 are not in the ON state thereof. The cell current 102 therefore flows through the calibration transistor 60 and the switch 62.

In addition, during the operation for calibration, the current mirror circuit 23 including the transistors 20 and 22 equalizes the current flowing through the current source cell 12 to the reference current 104. The sum of the cell current 102 and the current 106 flowing into the current comparator 24 is therefore equal to the reference current 104. That renders the current substantially equivalent to the difference between the reference current 104 and the cell current 102 flow into the current comparator 24.

The current comparator 24 compares the input current 106 to the predetermined threshold value. The comparator 24 determines which is larger of the reference current 104 and the cell current 102 and outputs the decision result 108 to the logic circuit 26.

The logic circuit 26 determines, in response to the decision result 108 of the current comparator 24, the correction value 110 which directs the current quantity 112 for the current corrector 50 during the regular operation.

The D/A converter 10 of the illustrative embodiment carries out the above-described operation for calibration for each of the plurality of current source cells 12. Thus, if the currents developed by the current source cells 12 are different between the cells due to a variation in manufacturing process, the D/A converter 10 may efficiently correct the currents in terms of the difference.

Figure 3:
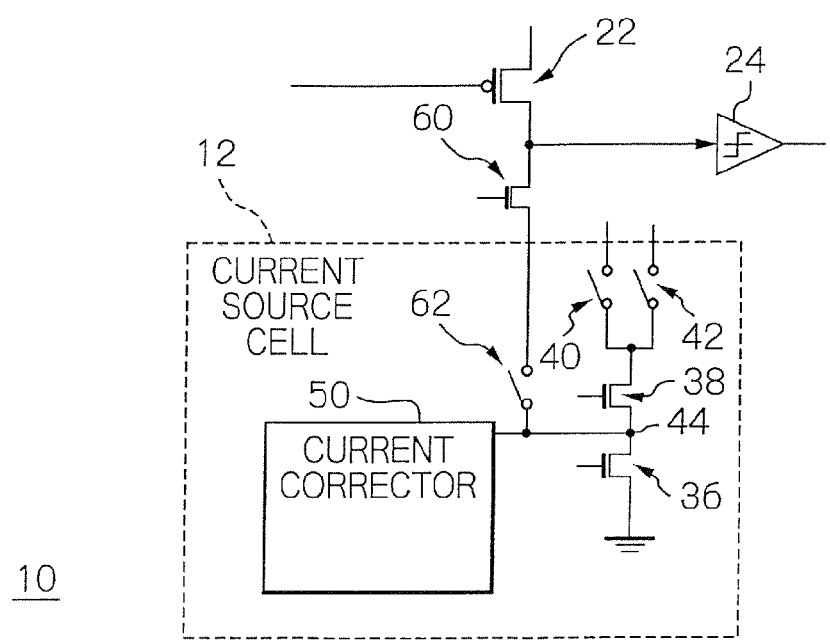
FIG. 3 is a schematic block diagram showing part of an alternative embodiment in which the calibration transistor is disposed outside the current source cells of the D/A converter.

In an alternative embodiment, the D/A converter 10 may include, as shown in FIG. 3, a sole calibration transistor 60 on the outside of the current source cells 12 so as to be shared with the plurality of current source cells 12, each of which includes a switch 62 which is arranged to be controlled to change over its conductive state to the common calibration transistor 60.

Moreover, with the D/A converter 10 of the illustrative embodiment, it is possible to provide with a sole current corrector 50 on the outer side of the current source cell 12 to correct the cell current 102 in the current source block 51 of the current source cell 12. In this case, the current corrector 50 may be used to be shared with the plurality of current source cells 12.

According to the illustrative embodiment, the D/A converter 10 can correct the cell current 103 (102) flowing in the current source block 51 of the current source cell 12 without using the current comparator 24. For example, the D/A converter 10 may be configured so as to calibrate by converting the cell current to a corresponding voltage, further converting the voltage to a digital data by A/D conversion and determining the digital-converted result in comparison.

In addition, the D/A converter 10 of the embodiments is able to execute the calibration no matter whether the respective cell current quantities of the plurality of current source cells 12 are equal to or different from each other. For example, there is a type of current source cells which can execute weighting correction, to which the calibration transistor 60 of the present invention may be applied without influencing the weighting correction.

In the D/A converter 10 of the embodiments, the current source in the current source block 51 of the current source cells 12 may be constructed by applying a gain boost cascode connection. Alternatively, the current source may be constructed to include two cascode connections. The transistors in the current source of the current source cell 12 may be an NMOS or a PMOS transistor.

The entire disclosure of Japanese patent application No. 2007-181972 filed on Jul. 11, 2007, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A digital-to-analog (D/A) converter including a plurality of current source cells arranged in a matrix configuration; said D/A converter comprising:

an output current path section for digital-to-analog conversion in a regular operation and a correcting current path section for a calibration operation used as a current path for conducting a cell current generated in said current source cell, each of said plurality of current source cells including a first transistor serving as a current source that generates the cell current corresponding to a predetermined bias voltage applied thereto, said current source cell being operative so that said first transistor is connected during the regular operation to said output current path section in cascade to flow the cell current through said output current path section and during the calibration operation to said correcting current path section in cascade to flow the cell current through said correcting current path section; and a current corrector operative in response to a correction value obtained on said correcting current path section for generating a correction current that is used for correcting the cell current;

wherein said correcting current path section includes:

a current comparator for comparing the cell current to a predetermined reference current; and logic processing circuitry for determining the correction value in accordance with a result of comparison by said current comparator.

2. The D/A converter in accordance with claim 1, wherein said output current path section includes a second transistor connected in cascade to said first transistor during the regular operation, said correcting current path section including a third transistor connected in cascade to said first transistor during the calibration operation.

3. The D/A converter in accordance with claim 2, wherein said third transistor is provided in each of said plurality of current source cells.

4. The D/A converter in accordance with claim 2, wherein said third transistor is provided to be shared with said plurality of current source cells.

5. The D/A converter in accordance with claim 1, wherein said current corrector is provided in each of said plurality of current source cells.

6. The D/A converter in accordance with claim 1, wherein said current corrector is provided to be shared with said plurality of current source cells.

* * * * *